United States Patent
Li et al.

(10) Patent No.: US 12,451,843 B2
(45) Date of Patent: Oct. 21, 2025

(54) ENVELOPE TRACKING METHOD AND DEVICE

(71) Applicant: ZTE Corporation, Shenzhen (CN)

(72) Inventors: Shengqi Li, Shenzhen (CN); Linguo Wang, Shenzhen (CN)

(73) Assignee: ZTE CORPORATION, Shenzhen (CN)

(*) Notice: Subject to any disclaimer, the term of this patent is extended or adjusted under 35 U.S.C. 154(b) by 665 days.

(21) Appl. No.: 17/769,821

(22) PCT Filed: Oct. 16, 2020

(86) PCT No.: PCT/CN2020/121598
§ 371 (c)(1),
(2) Date: Apr. 18, 2022

(87) PCT Pub. No.: WO2021/073612
PCT Pub. Date: Apr. 22, 2021

(65) Prior Publication Data
US 2022/0360228 A1 Nov. 10, 2022

(30) Foreign Application Priority Data
Oct. 16, 2019 (CN) .......................... 201910984844.7

(51) Int. Cl.
*H03F 1/02* (2006.01)
*H03F 3/45* (2006.01)

(52) U.S. Cl.
CPC ....... *H03F 1/0233* (2013.01); *H03F 3/45475* (2013.01); *H03F 2200/105* (2013.01)

(58) Field of Classification Search
CPC .. H03F 1/0233; H03F 1/0216; H03F 3/45475; H03F 3/213; H03F 2200/105;
(Continued)

(56) References Cited

U.S. PATENT DOCUMENTS 9,831,834 B2 * 11/2017 Balteanu ................. H03F 3/195
2016/0336853 A1 * 11/2016 Meier ................... H02M 3/156
(Continued)

FOREIGN PATENT DOCUMENTS

CN  102684494 A  9/2012
CN  103597741 A  2/2014
(Continued)

OTHER PUBLICATIONS

"Direct Coupled Inverting Amplifier" EEEGuide.com.*
(Continued)

*Primary Examiner* — Andrea Lindgren Baltzell
*Assistant Examiner* — Nareh Shamiryan
(74) *Attorney, Agent, or Firm* — CANTOR COLBURN LLP

(57) ABSTRACT

An envelope tracking method and device are provided. The envelope tracking method includes: acquiring, by a boost circuit, a target envelope tracking input current signal, and transmitting, by the boost circuit, the target envelope tracking input current signal to an amplifier circuit, where the amplifier circuit includes an operational amplifier and a feedback network, and the operational amplifier operates in a mode of floating ground; and performing, by the amplifier circuit, closed-loop conversion and amplification on the target envelope tracking input current signal and outputting, by the amplifier circuit, an envelope tracking output voltage.

16 Claims, 10 Drawing Sheets

(58) Field of Classification Search
CPC ......... H03F 2200/102; H03F 2200/129; H03F 2203/45161; H03F 2203/45528; H03F 2203/45578; H03F 2203/45582; H01L 2924/1425
USPC ........................................................ 330/252
See application file for complete search history.

(56) References Cited

U.S. PATENT DOCUMENTS

| | | | |
|---|---|---|---|
| 2016/0336901 A1* | 11/2016 | Khesbak | ........... H04W 52/0261 |
| 2018/0375476 A1 | 12/2018 | Balteanu | |
| 2018/0375483 A1 | 12/2018 | Balteanu | |
| 2020/0106408 A1* | 4/2020 | Rotzoll | ..................... H03F 3/24 |

FOREIGN PATENT DOCUMENTS

| | | |
|---|---|---|
| CN | 206389368 U | 8/2017 |
| CN | 11014618 A | 8/2019 |
| JP | 2011254603 A | 12/2011 |
| WO | 2018023215 A1 | 2/2018 |

OTHER PUBLICATIONS

EEEGuide Direct Coupled Inverting Amplifier.*
European Search Report for corresponding application EP 20 87 6347; Report dated Nov. 24, 2022.
International Search Report for corresponding application PCT/CN2020/121598 filed Oct. 16, 2020; Mail date Jan. 19, 2021.
Chinese Office Action; Application No. 201910984844.7; Filing Date: Oct. 16, 2019; date of mailing: Aug. 22, 2025; 11 pages.

* cited by examiner

ENVELOPE TRACKING METHOD AND DEVICE

CROSS REFERENCE

This application is a National Stage Filing of the PCT International Application No. PCT/CN2020/121598 filed on Oct. 16, 2020, which claims priority to Chinese Applicant No. 201910984844.7 filed on Oct. 16, 2019, the entirety of which is herein incorporated by reference.

TECHNICAL FIELD

Embodiments of the present disclosure relate to, but are not limited to, the technical field of electronic devices, and specifically relate to, but are not limited to, an envelope tracking method and device.

BACKGROUND

Envelope tracking technologies can be applied in many fields such as the field of communications. An output of an envelope tracking power supply may change with the change of a required signal. A bandwidth of the output of the envelope tracking power supply is relatively high and generally ranges from several megahertz to hundreds of megahertz. The envelope tracking power supply is usually used in an envelope tracking power amplifier circuit to supply power to the power amplifier, so that a voltage of the power supply of the power amplifier changes with the change in a power of a signal to be amplified by the power amplifier, thereby improving the efficiency of the power amplifier.

In the related art, an input envelope signal is generally amplified and tracked via a one-stage operational amplifier (with reference to FIG. 1) or via a two-stage operational amplifier (with reference to FIG. 2).

As shown in FIG. 1, the one-stage operational amplifier circuit used is simple and has small power consumption. However, when a magnitude of an output voltage is large, since a gain of operational amplification cannot be too large to improve a bandwidth of the envelope signal to be tracked, a magnitude of the input envelope signal Ui is required to be relatively large, which is generally difficult to realize.

In FIG. 2, when the two-stage operational amplifier circuit is used, the magnitude of the input envelope signal is allowed to be relatively small, which is easy to realize. However, because one-stage operational amplifier has to be added, the number of devices is increased and therefore the power consumption is relatively large and signal delay is increased, which also has a certain impact on the efficiency.

When the envelope tracking power amplifier requires a relatively wide range of power supply envelope voltage, such as 10 v-30 v, a range of the output voltage of the envelope tracking power supply is also relatively wide correspondingly, and should be, e.g., 10 v-30 v. If the above circuits in the related art are used to perform amplification and tracking, the power supply voltage should be above 30 v because the range of the output voltage of the operational amplification is relatively wide. Further, the output voltage has a large swing, a high magnitude, and a high frequency. Under such conditions, if the circuit in FIG. 1 is used, the magnitude of the required input envelope signal Ui is very large, which is difficult to realize. If the circuit in FIG. 2 is used, too many devices are used, and the loss of the operational amplification is large, which affects the efficiency. Although the efficiency of the power amplifier is improved, the efficiency of the envelope tracking power supply of the power supply part is reduced, which affects the overall efficiency. Therefore, in the related art, when an envelope tracking output voltage has a large magnitude, the loss of the operational amplifier in a linear amplification process is relatively large, and the efficiency is relatively low.

SUMMARY

The envelope tracking method and device provided by the embodiments of the present disclosure mainly solve the technical problems that in the related art the loss of an operational amplifier in a linear amplification process is relatively large and the efficiency is relatively low when an envelope tracking output voltage has a large magnitude.

Some embodiments of the present disclosure provide an envelope tracking device, including an amplifier circuit and a boost circuit. The amplifier circuit includes an operational amplifier and a feedback network.

The operational amplifier includes a non-inverting input terminal, a power supply negative terminal, a power supply positive terminal, an inverting input terminal and an output terminal of the operational amplifier. A reference voltage VREF is applied on the non-inverting input terminal. The power supply negative terminal is connected to a first voltage supply VEE. The power supply positive terminal is connected to a second voltage supply VCC. The reference voltage VREF has a voltage value greater than a voltage value of the first voltage supply VEE. The reference voltage VREF has a voltage value smaller than a voltage value of the second voltage supply VCC. The voltage value of the first voltage supply VEE is greater than zero.

A first terminal of the boost circuit receives a target envelope tracking input current signal, and a second terminal of the boost circuit is connected to the inverting input terminal, and configured to transmit the target envelope tracking input current signal to the inverting input terminal via the boost circuit, wherein the target envelope tracking input current signal is then transmitted to the operational amplifier.

A first terminal of the feedback network is connected to the inverting input terminal, and a second terminal of the feedback network is connected to an output terminal of the operational amplifier, and configured to transmit an output voltage signal of the output terminal of the operational amplifier to the inverting input terminal.

The amplifier circuit is configured to perform closed-loop conversion and amplification on the target envelope tracking input current signal, and the output terminal of the operational amplifier outputs an envelope tracking output voltage.

Some embodiments of the present disclosure provide an envelope tracking method, including the following operations.

A boost circuit acquires a target envelope tracking input current signal, and transmits the target envelope tracking input current signal to an amplifier circuit. The amplifier circuit includes an operational amplifier and a feedback network. The operational amplifier operates in a mode of floating ground.

The amplifier circuit performs closed-loop conversion and amplification on the target envelope tracking input current signal, and outputs an envelope tracking output voltage.

Other features of the present disclosure and corresponding benefits are set forth in the following portions of the specification, and it should be understood that at least a part of the benefits becomes apparent from the recitation of the present disclosure.

BRIEF DESCRIPTION OF THE DRAWINGS

FIG. 6-1 is a schematic diagram of a circuit of another envelope tracking device according to Embodiment 1 of the present disclosure;

FIG. 6-2 is a schematic diagram of a circuit of another envelope tracking device according to Embodiment 1 of the present disclosure;

FIG. 6-3 is a schematic diagram of a circuit of another envelope tracking device according to Embodiment 1 of the present disclosure;

FIG. 15-1 is a schematic diagram of a waveform of an envelope tracking output voltage based on the principle of a circuit of an envelope tracking device according to Embodiment 1 of the present disclosure;

FIG. 15-2 is a schematic diagram of a waveform of a target envelope tracking input current signal sent into an operational amplifier based on the principle of a circuit of an envelope tracking device according to Embodiment 1 of the present disclosure;

DETAILED DESCRIPTION

In order to make the objectives, technical solutions and advantages of the present disclosure more clear, embodiments of the present disclosure are further described in detail below by means of exemplary implementations in conjunction with the accompanying drawings. It should be understood that the exemplary embodiments described herein are only used to explain the present disclosure, but not to limit the present disclosure.

Embodiment 1

Figure 3:
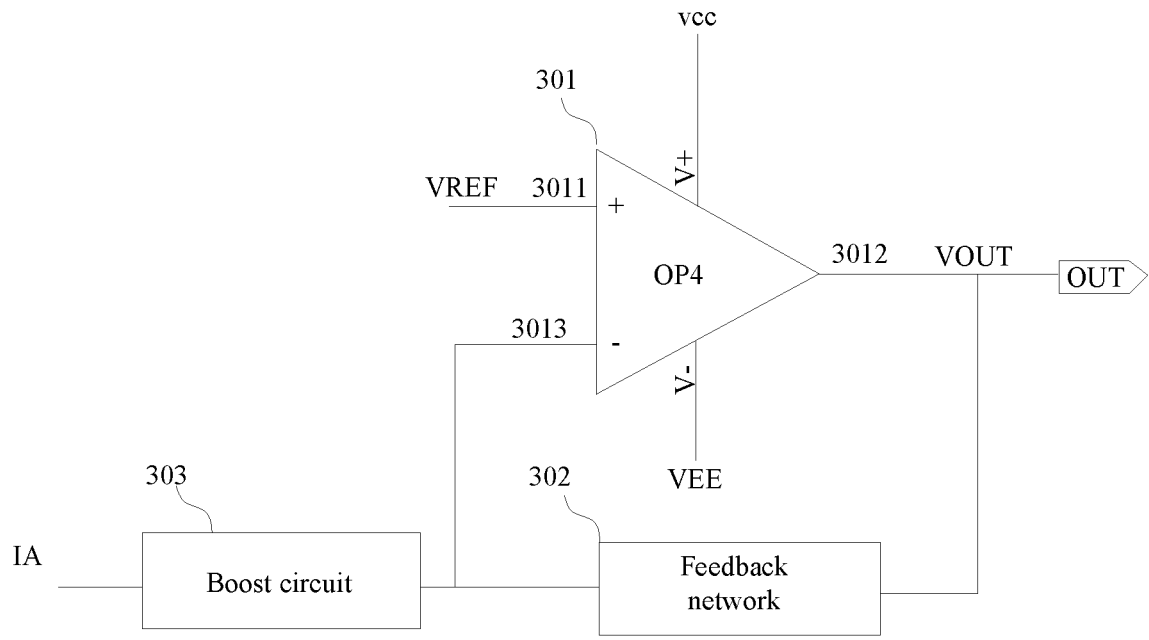
FIG. 3 is a schematic diagram of a circuit of an envelope tracking device according to Embodiment 1 of the present disclosure.

Referring to FIG. 3, an envelope tracking device provided in the present embodiment includes an amplifier circuit and a boost circuit 303. The amplifier circuit includes an operational amplifier 301 and a feedback network 302.

The operational amplifier 301 includes a non-inverting input terminal 3011, a power supply negative terminal V−, a power supply positive terminal V+, an inverting input terminal 3013 and an output terminal 3012 of the operational amplifier. A reference voltage VREF is applied on the non-inverting input terminal 3011. The power supply negative terminal V− is connected to a first voltage supply VEE. The first voltage supply VEE has the capability of outputting and inputting a current. The power supply positive terminal V+ is connected to a second voltage supply VCC. The reference voltage VREF has a voltage value greater than a voltage value of the first voltage supply VEE. The reference voltage VREF has a voltage value smaller than a voltage value of the second voltage supply VCC. The voltage value of the first voltage supply VEE is greater than zero.

A first terminal of the boost circuit 303 receives a target envelope tracking input current signal IA. A second terminal of the boost circuit 303 is connected to the inverting input terminal 3013, and configured to transmit the target envelope tracking input current signal to the inverting input terminal 3013 via a boost circuit, wherein the target envelope tracking input current signal is then transmitted to the operational amplifier 301.

A first terminal of the feedback network 302 is connected to the inverting input terminal 3013. A second terminal of the feedback network 302 is connected to an output terminal 3012 of the operational amplifier, and configured to transmit an output voltage signal of the output terminal 3012 of the operational amplifier to the inverting input terminal 3013.

The amplifier circuit is configured to perform closed-loop conversion and amplification on the target envelope tracking input current signal. The output terminal 3012 of the operational amplifier outputs an envelope tracking output voltage VOUT.

In some embodiments, the boost circuit transmits the target envelope tracking input current signal. Because a current signal is transmitted through the boost circuit, a magnitude of the current signal is not changed after the current signal passes through the boost circuit. That is, the magnitude of the target envelope tracking input current signal input into the boost circuit is consistent with the magnitude of the target envelope tracking input current signal output by the boost circuit.

In some embodiments, a magnitude of the reference voltage VREF applied on the non-inverting input terminal of the operational amplifier may be set by a person having ordinary skill in the art as required.

According to the principle of the operational amplifier, voltage levels of the non-inverting input terminal 3011 and the inverting input terminal 3013 are consistent.

In some embodiments, the voltage of the first voltage supply VEE connected to the power supply negative terminal V− is smaller than the voltage of the second voltage supply VCC connected to the power supply positive terminal V+ and the first voltage supply VEE is not directly grounded. Therefore, an actual power supply voltage of the operational amplifier is a voltage difference between the power supply positive terminal V+ and the power supply negative terminal V−, so as to reduce a range of the actual operating power supply voltage of the operational amplifier. That is, the operational amplifier operates in a mode of floating ground, thereby reducing the power consumption of the operational amplifier and improving amplification efficiency.

The first voltage supply VEE connected to the power supply negative terminal V−, the second voltage supply VCC connected to the power supply positive terminal V+, and the reference voltage VREF meet a relationship of VCC>VREF>VEE>0V.

In some embodiments, the first voltage supply has the capability of outputting and inputting a current.

Figure 4:
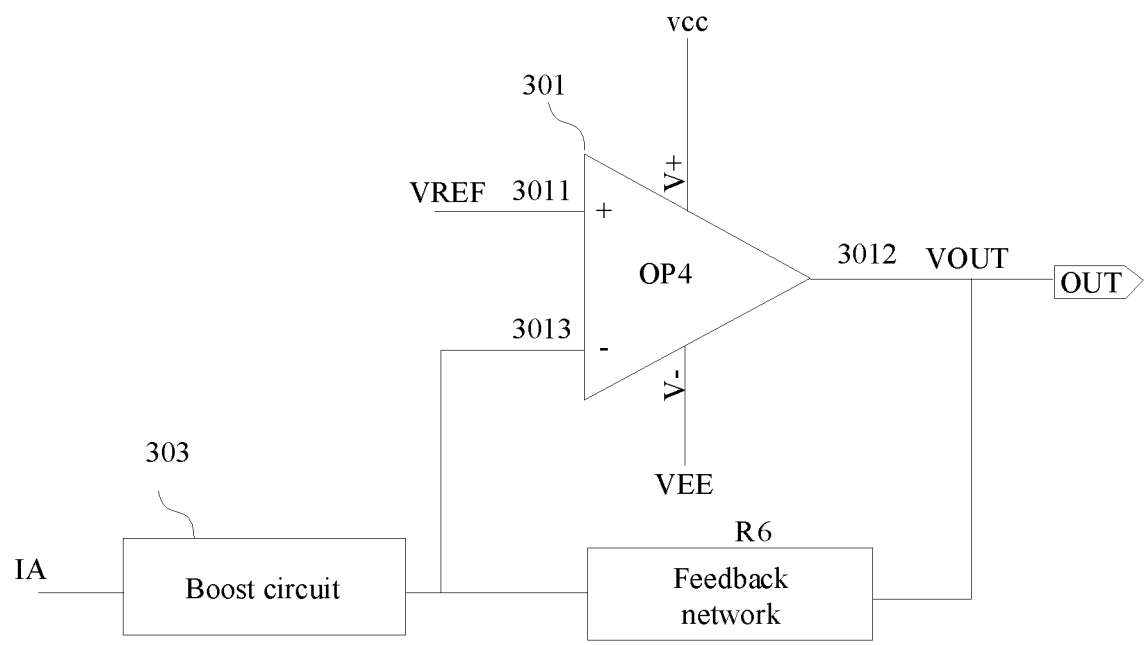
FIG. 4 is a schematic diagram of a circuit of another envelope tracking device according to Embodiment 1 of the present disclosure.

In some embodiments, referring to FIG. 4, the feedback network consists of a feedback resistor R6. The feedback resistor R6 is connected between the inverting input terminal 3013 of the operational amplifier and the output terminal 3012 of the operational amplifier. According to the principle of the circuit, under an ideal condition, the magnitude of the current flowing through the feedback resistor R6 is consistent with the magnitude of the current of the target envelope tracking input current signal IA. The target envelope tracking input current signal IA is applied to the inverting input terminal 3013 of the operational amplifier after passing through the boost circuit, and is converted by the operational amplifier 301 and the feedback resistor R6 to acquire an amplified output envelope tracking output voltage VOUT. In some embodiments, a conversion formula between the target envelope tracking input current signal IA and the output envelope tracking output voltage VOUT meets the following relationship: VOUT=VREF+R6*IA. A magnitude of the output voltage VOUT is between the VREF and the VCC. By virtue of this circuit, the target envelope tracking input current signal IA is amplified into the output envelope tracking output voltage VOUT. An absolute value of an actual operating voltage of an operational amplifier OP4 is VCC−VEE. An actual output swing of the operational amplifier OP4 is between (VREF−VEE) and (VCC−VEE), so that the operational amplifier can operate in the mode of the floating ground, which reduces the loss of the operational amplifier OP4 and improves the efficiency.

Figure 5:
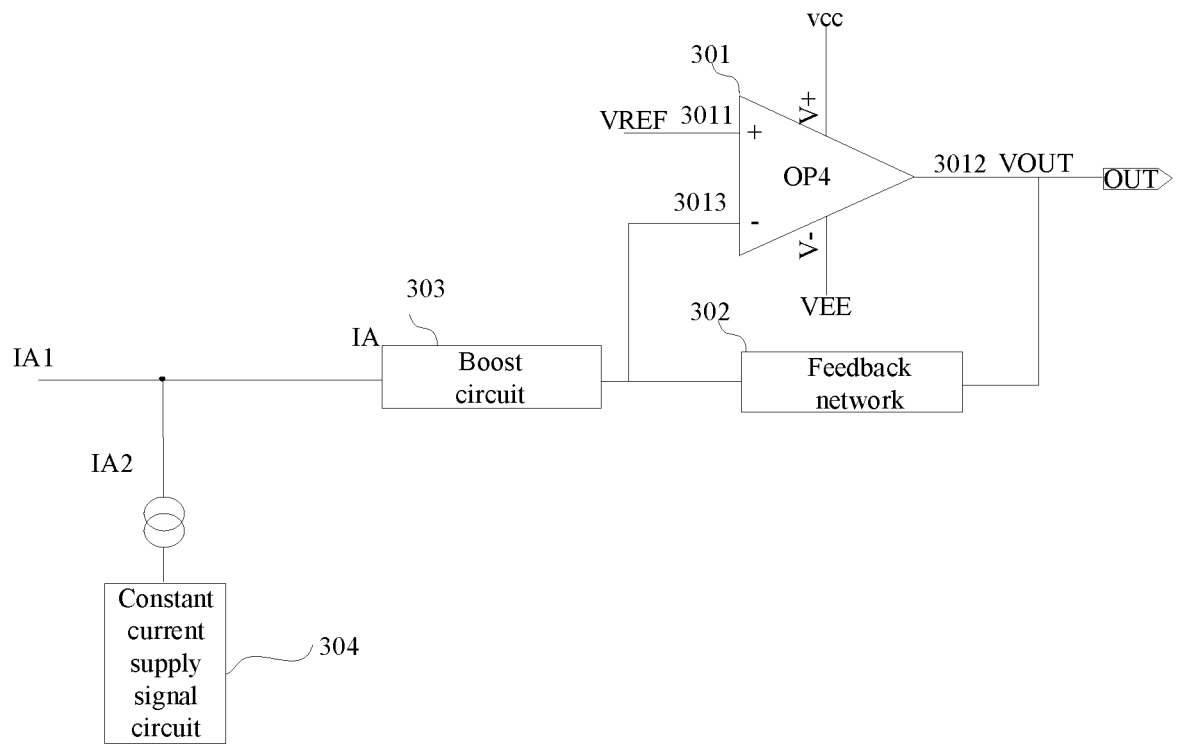
FIG. 5 is a schematic diagram of a circuit of another envelope tracking device according to Embodiment 1 of the present disclosure.

In some embodiments, as shown in FIG. 5, the envelope tracking device further includes a constant current supply signal circuit 304. The constant current supply signal circuit 304 is connected to the first terminal of the boost circuit 303, and configured to convert an envelope tracking input current signal IA1 into the target envelope tracking input current signal IA. In order to meet the requirements of the boost circuit, the target envelope tracking input current signal is a negative current. That is, the target envelope tracking input current signal is in a direction from the second terminal of the boost circuit to the first terminal of the boost circuit. The constant current supply signal circuit 304 provides a DC constant current supply current signal IA2 with a constant output. A direction and a magnitude of the constant current supply current signal IA2 may be set by the person having ordinary skill in the art as required.

Figure 1:
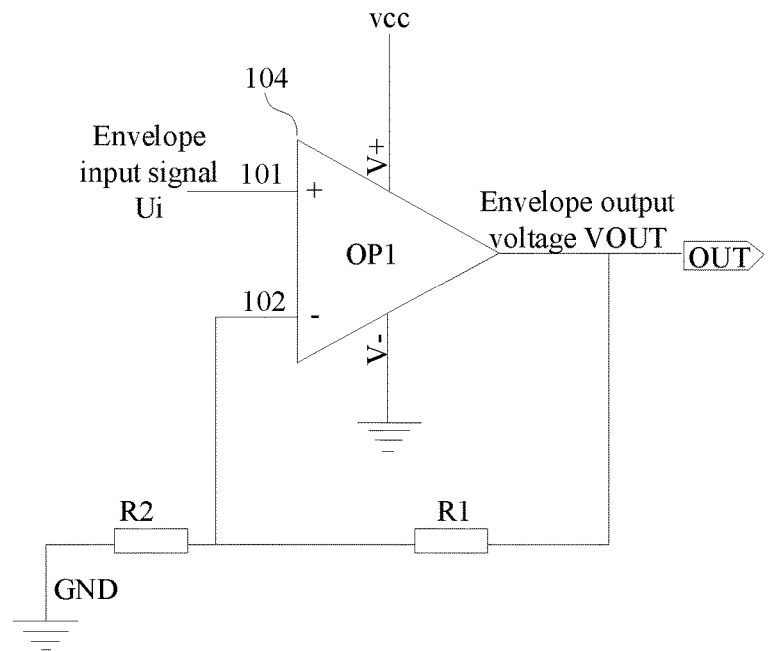
FIG. 1 shows a circuit for tracking and amplifying an envelope signal in the related art in the technical background of the present disclosure.
Figures 1, 6:
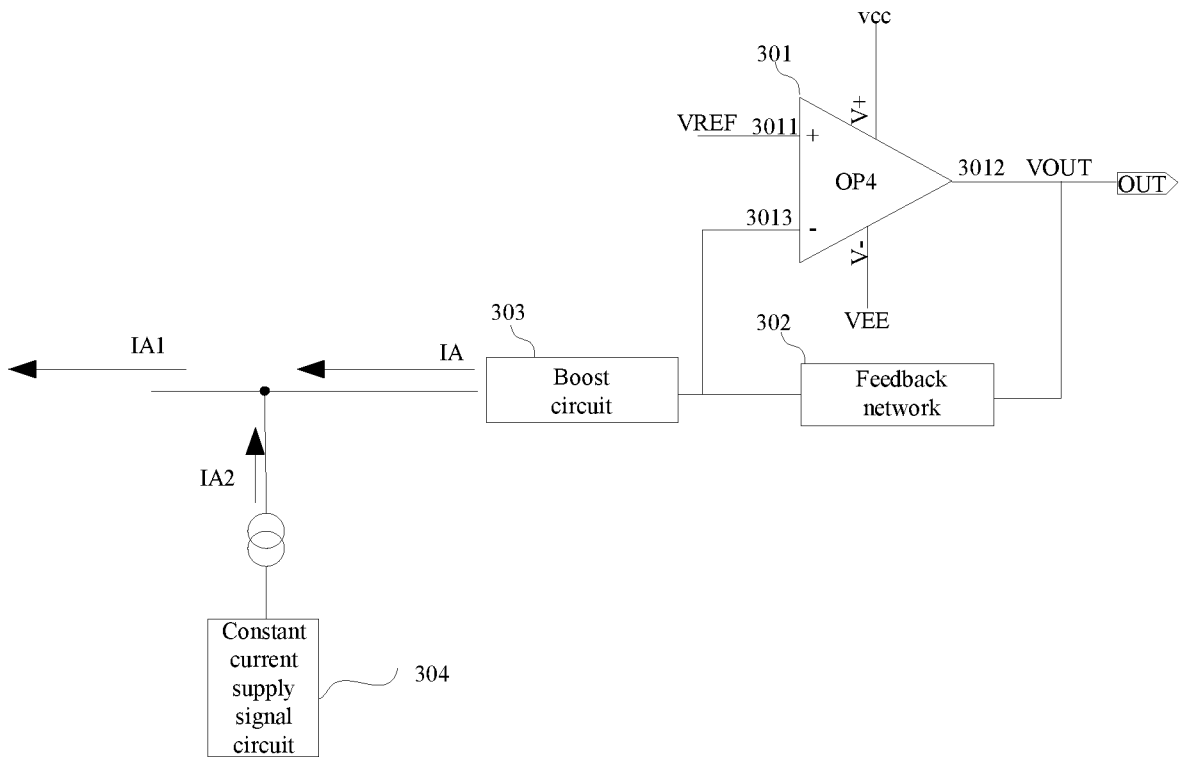
Figures 2, 6:
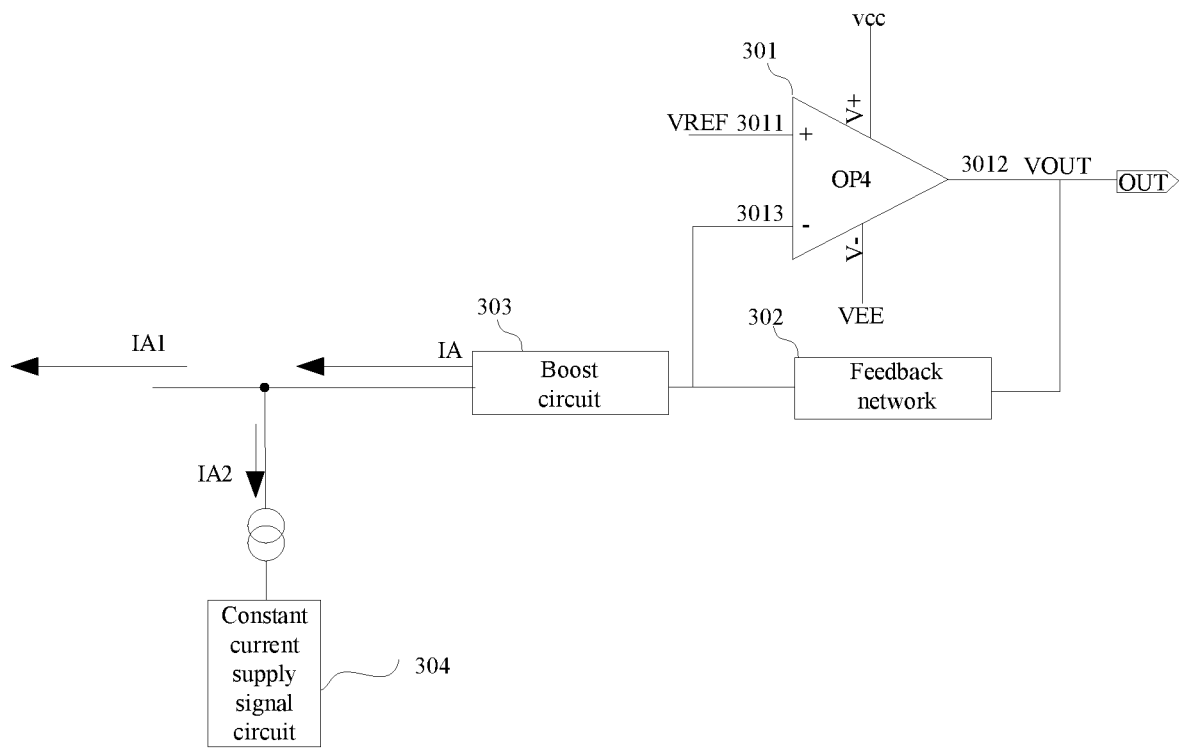
Figures 3, 6:
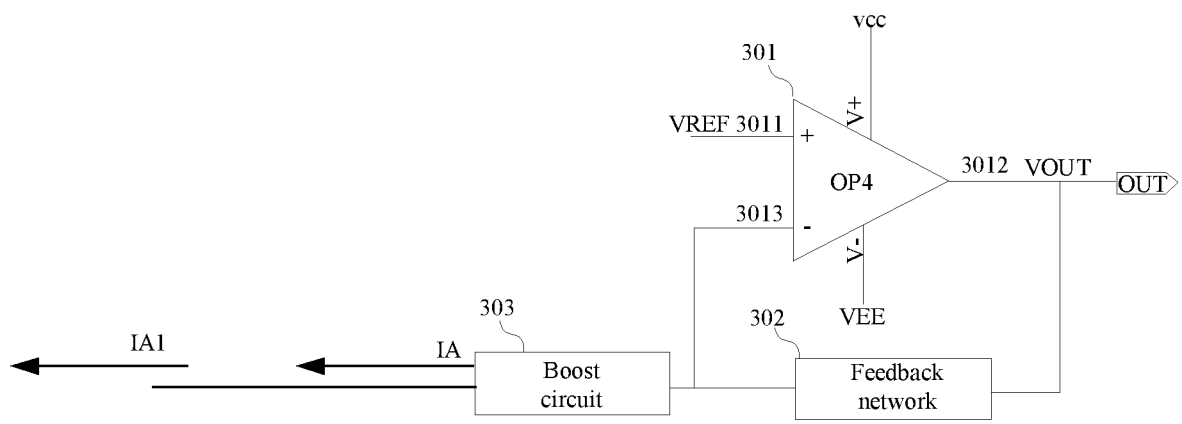

In some embodiments, as shown in FIG. 6-1, if the envelope tracking input current signal IA1 is a negative current, and the constant current supply current signal IA2 is a positive current, the constant current supply current signal IA2 of the constant current supply signal circuit 304 may be subtracted from the envelope tracking input current signal IA1 to acquire the target envelope tracking input current signal IA, that is, IA=IA1−IA2 (IA2≤IA1). If the envelope tracking input current signal IA1 is a negative current, whether the constant current supply signal circuit 304 needs to be provided may be determined as required.

Figure 2:
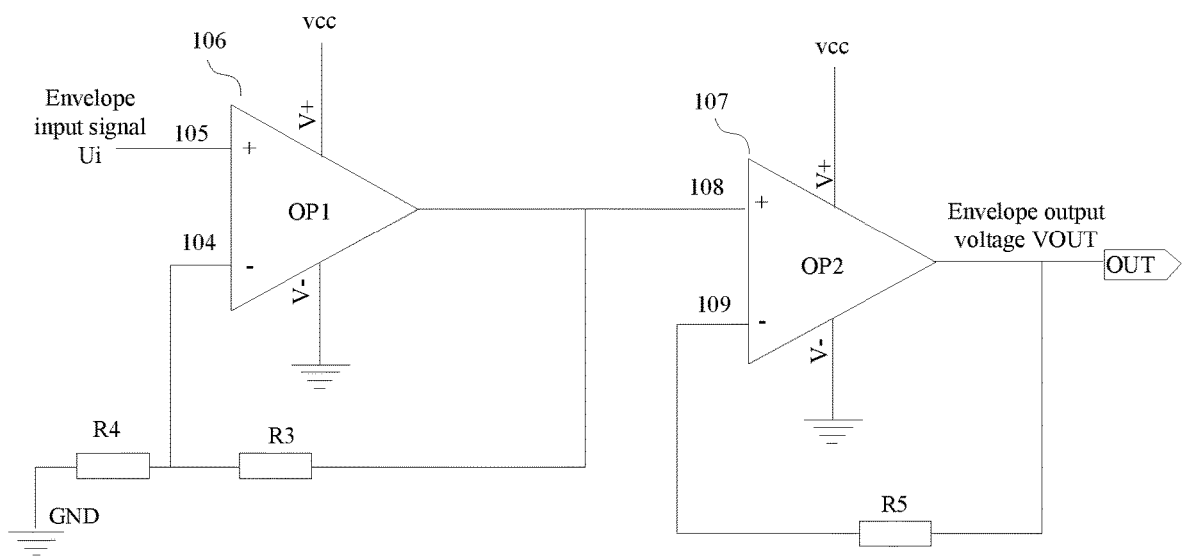
FIG. 2 shows another circuit for tracking and amplifying an envelope signal in the related art in the technical background of the present disclosure.

In some embodiments, as shown in FIG. 6-2, if the envelope tracking input current signal IA1 is a negative current, and the constant current supply current signal IA2 is also a negative current, the envelope tracking input current signal IA1 may be added to the constant current supply current signal IA2 of the constant current supply signal circuit 304 to acquire the target envelope tracking input current signal IA, that is, IA=IA1+IA2. Under such conditions, a magnitude relationship of the IA1 and the IA2 is not limited.

For the constant current supply signal circuit 304, the current signal flowing into the constant current supply signal circuit 304 is a negative current, and the current signal flowing out of the constant current supply signal circuit 304 is a positive current.

In some embodiments, as shown in FIG. 6-3, if the envelope tracking input current signal IA1 is a negative current, the constant current supply signal circuit may not be provided.

If the envelope tracking input current signal IA1 is a negative current, the current of the constant current supply current signal IA2 may be either a positive current (as shown in FIG. 6-1) or a negative current (as shown in FIG. 6-2). If the envelope tracking input current signal IA1 is a positive current, the current of the constant current supply current signal IA2 can only be a negative current (as shown in FIG. 7).

Figure 7:
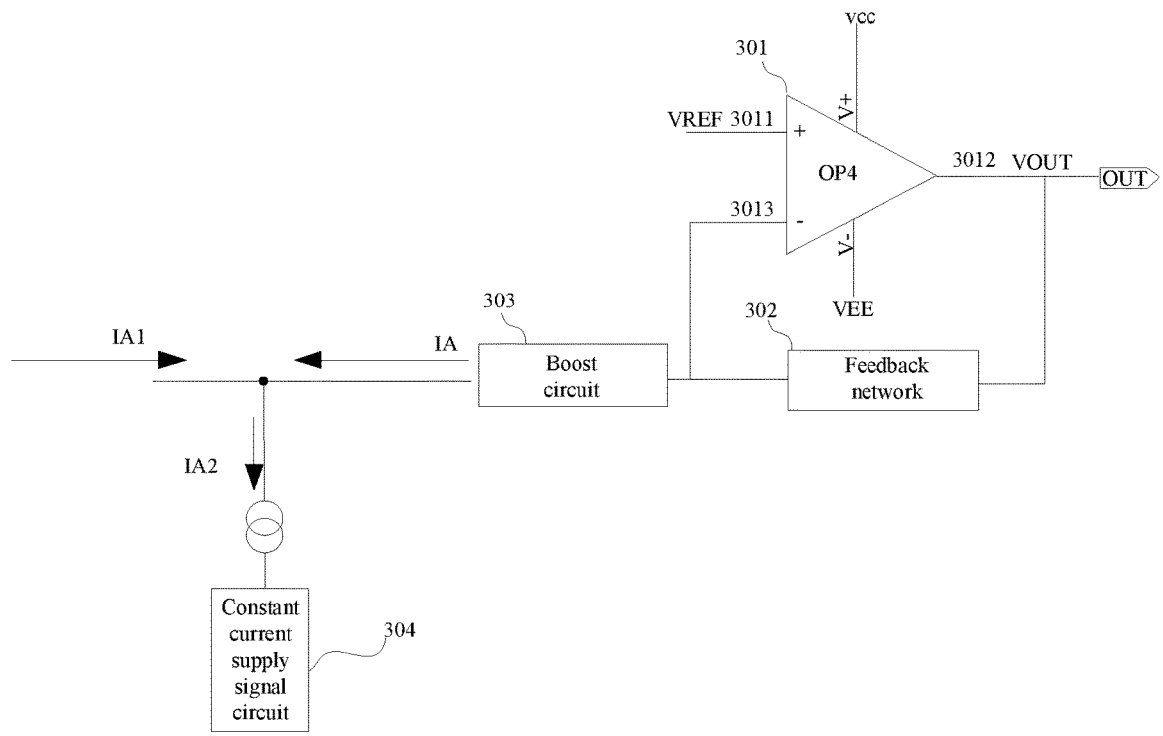
FIG. 7 is a schematic diagram of a circuit of another envelope tracking device according to Embodiment 1 of the present disclosure.

In some embodiments, as shown in FIG. 7, if the envelope tracking input current signal IA1 is a positive current, the envelope tracking input current signal IA1 may be subtracted from the constant current supply current signal IA2 of the constant current supply signal circuit 304 to acquire the target envelope tracking input current signal IA, that is, IA=IA2−IA1 (IA1≤IA2). If the envelope tracking input current signal IA1 is a positive current, the constant current supply signal circuit needs to be provided. Through the constant current supply signal circuit, a DC current supply current signal with a constant magnitude can be generated for processing the envelope tracking input current signal IA1, so that the target envelope tracking input current signal IA meets the requirements.

Figure 8:
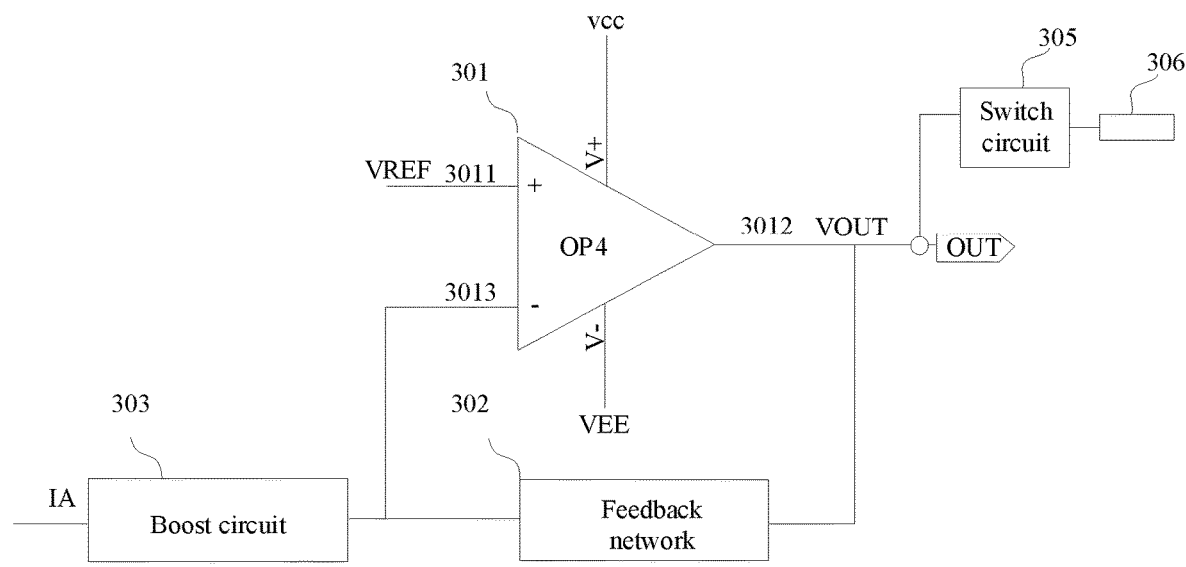
FIG. 8 is a schematic diagram of a circuit of another envelope tracking device according to Embodiment 1 of the present disclosure.

In some embodiments, as shown in FIG. 8, the envelope tracking device further includes a switch circuit 305 connected to the output terminal 3012 of the operational amplifier. The switch circuit 305 is connected to a load 306, and configured to provide a part of current required by the load 306 via the switch circuit 305 to reduce the output current of the operational amplifier 301.

In some embodiments, the switch circuit is connected in parallel with the output, so that a part of the current required by the load can be provided through the switch circuit to reduce an output current of the operational amplifier, and improve the efficiency of the operational amplifier. In some embodiments, the load may be a power amplifier.

Figure 9:
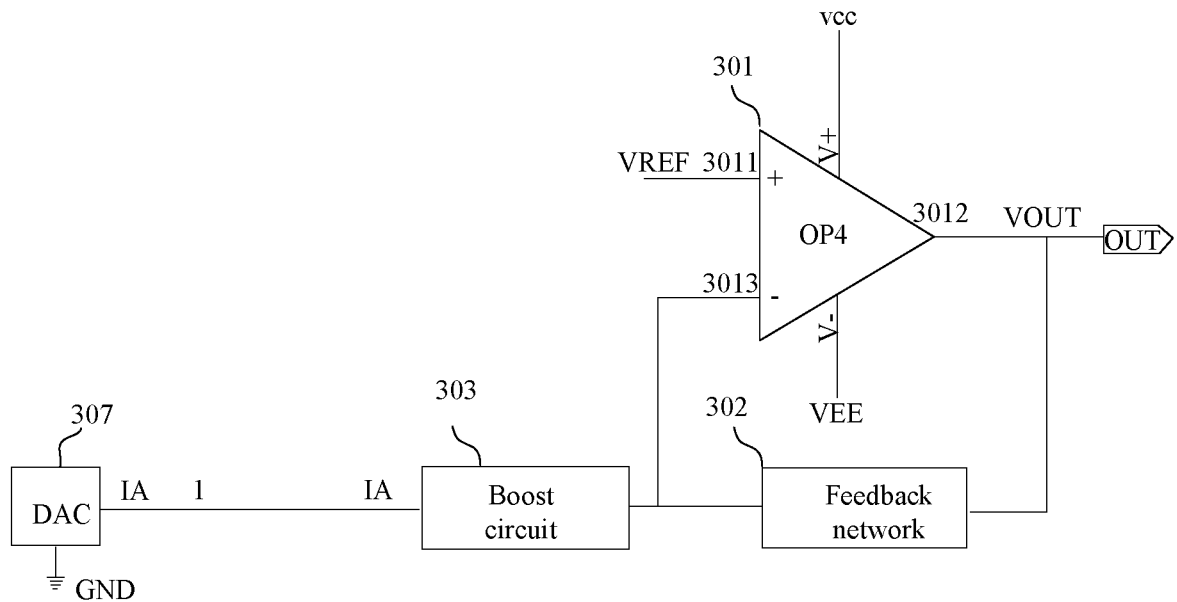
FIG. 9 is a schematic diagram of a circuit of another envelope tracking device according to Embodiment 1 of the present disclosure.

In some embodiments, as shown in FIG. 9, the envelope tracking device further includes a digital-to-analog converter (DAC) 307. A power supply negative terminal of the DAC 307 is grounded. An output terminal of the DAC 307 is connected to the boost circuit 303, and configured to output the envelope tracking input current signal IA1 after conversion. When the constant current supply signal circuit is not provided between the DAC and the boost circuit, the envelope tracking input current signal IA1 is the target envelope tracking input current signal IA. When the envelope tracking input current signal IA1 is a negative current, the current flows from the output terminal of the DAC into an inner part of the DAC.

Figure 10:
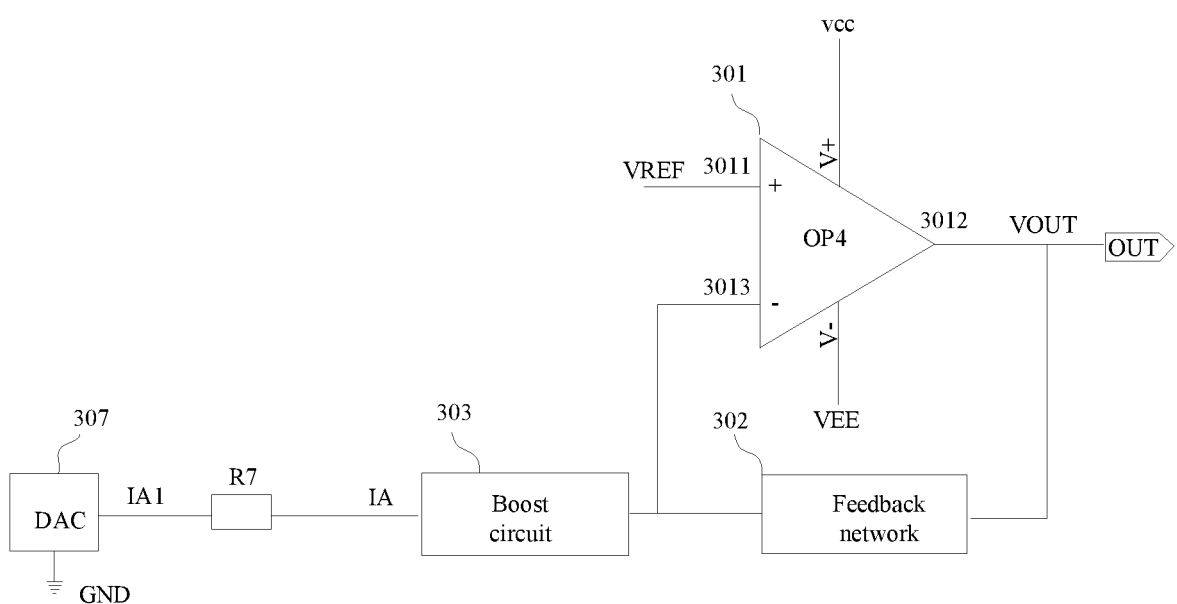
FIG. 10 is a schematic diagram of a circuit of another envelope tracking device according to Embodiment 1 of the present disclosure.

In some embodiments, as shown in FIG. 10, the envelope tracking device further includes a bias resistor R7. The bias resistor R7 is connected between the output terminal of the DAC 307 and the first terminal of the boost circuit 303, and configured to provide a bias voltage required for a normal operation of the DAC 307. In some embodiments, a magnitude of the bias voltage is as follows: VREF−voltage drop of the boost circuit−voltage drop of R7.

In some embodiments, a first terminal of the bias resistor is connected to the output terminal of the DAC, and the second terminal of the bias resistor is connected to the first terminal of the boost circuit.

In some embodiments, the boost circuit includes a zener diode and a capacitor. The zener diode is connected in parallel with the capacitor, and one terminal where a positive electrode of the zener diode is connected in parallel with the capacitor serves as the first terminal of the boost circuit.

Figure 11:
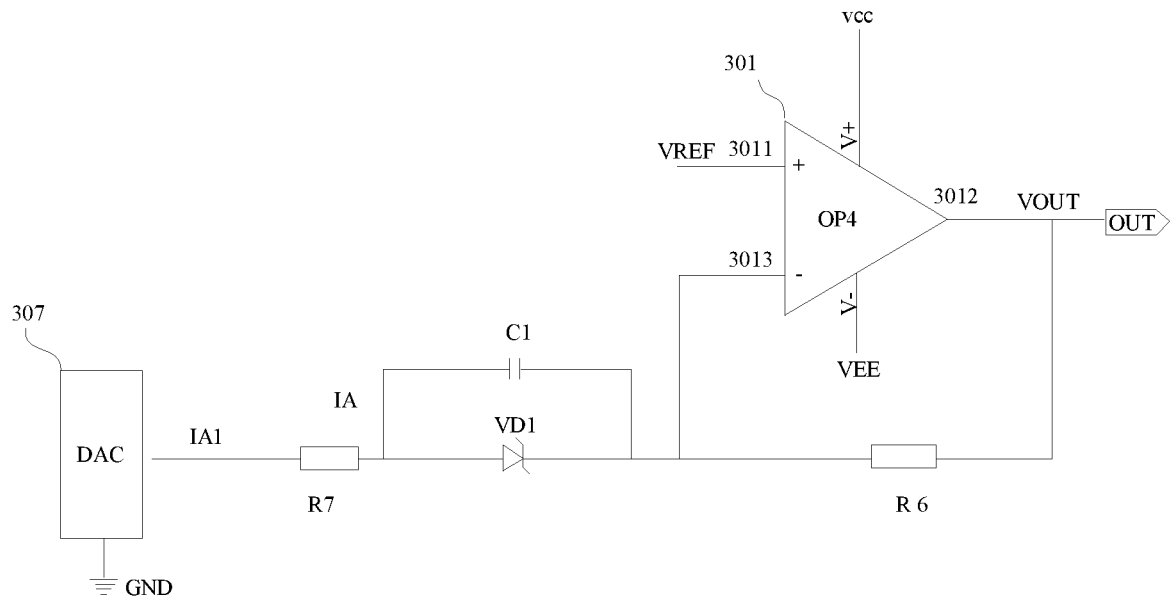
FIG. 11 is a schematic diagram of a circuit of another envelope tracking device according to Embodiment 1 of the present disclosure.

As shown in FIG. 11, the boost circuit may consist of a zener diode VD1 and a capacitor C1 that are connected in parallel with each other. Under such conditions, the target envelope tracking input current signal IA is connected to a second terminal of the bias resistor R7 from one terminal where the zener diode VD1 is connected in parallel with the capacitor C1 to provide a bias voltage required for operation of an output port of the DAC 307. A magnitude of the bias voltage is as follows: VREF−voltage drop of Vd1−voltage drop of R7. One terminal of a negative electrode of the zener diode VD1 is connected in parallel with one terminal of the capacitor C1 and then connected to the inverting input terminal 3013 of the operational amplifier 301. After the voltage is boosted by the zener diode VD1, the target envelope tracking input current signal IA is transmitted to the inverting input terminal 3013 of the operational amplifier 301. The target envelope tracking input current signal IA flows through the capacitor C1 and the zener diode VD1, and most of the current signal flows through the capacitor C1, so that the zener diode VD1 has a better voltage stabilization effect.

A resistance value of the bias resistor may be set as required by actual application, and a minimum value of the bias resistor may be 0Ω. The bias voltage required for operation is provided to the output terminal of the DAC via the bias resistor.

In some embodiments, the boost circuit includes a stabilized voltage supply.

Figure 12:
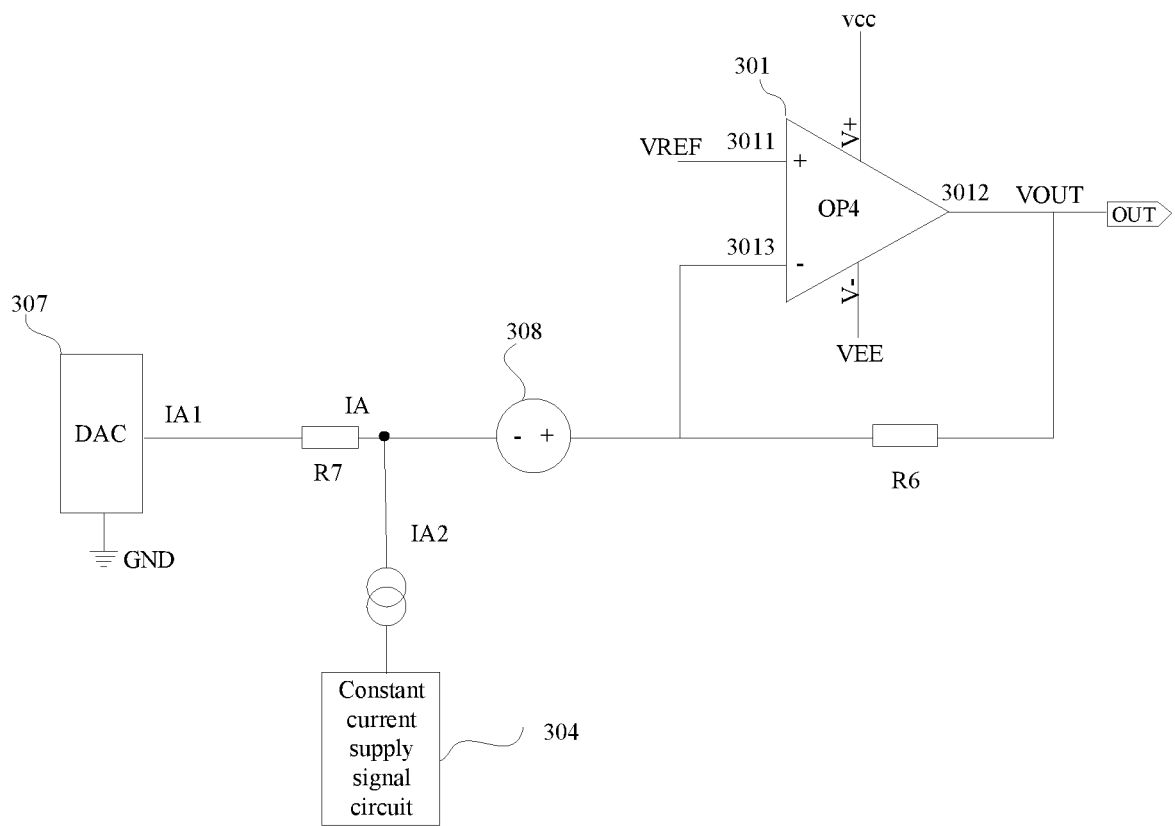
FIG. 12 is a schematic diagram of a circuit of another envelope tracking device according to Embodiment 1 of the present disclosure.

As shown in FIG. 12, the boost circuit may consist of a stabilized voltage supply 308. A positive terminal of the stabilized voltage supply 308 is connected to the inverting input terminal 3013. A negative terminal of the stabilized voltage supply 308 is connected to the second terminal of the bias resistor R7. The stabilized voltage supply 308 is configured to provide a suitable stabilized voltage, and transmit the target envelope tracking input current signal IA to the inverting input terminal 3013 of the operational amplifier 301. After the target envelope tracking input current signal IA is amplified by the operational amplifier 301, the envelope tracking output voltage VOUT is acquired. Under such conditions, a bias voltage required for operation of an output port of the DAC 307 is provided. A magnitude of the bias voltage is as follows: VREF−voltage of the stabilized voltage supply−voltage drop of R7.

In some embodiments, the switch circuit consists of a BUCK circuit and includes an inductor, a first MOS transistor, and a second MOS transistor.

A first terminal of the inductor is connected to the output terminal of the operational amplifier.

A source electrode of the first MOS transistor is grounded, and a drain electrode of the first MOS transistor is connected to a second terminal of the inductor.

A drain electrode of the second MOS transistor is connected to a power supply, and a source electrode of the second MOS transistor is connected to the second terminal of the inductor.

Figure 13:
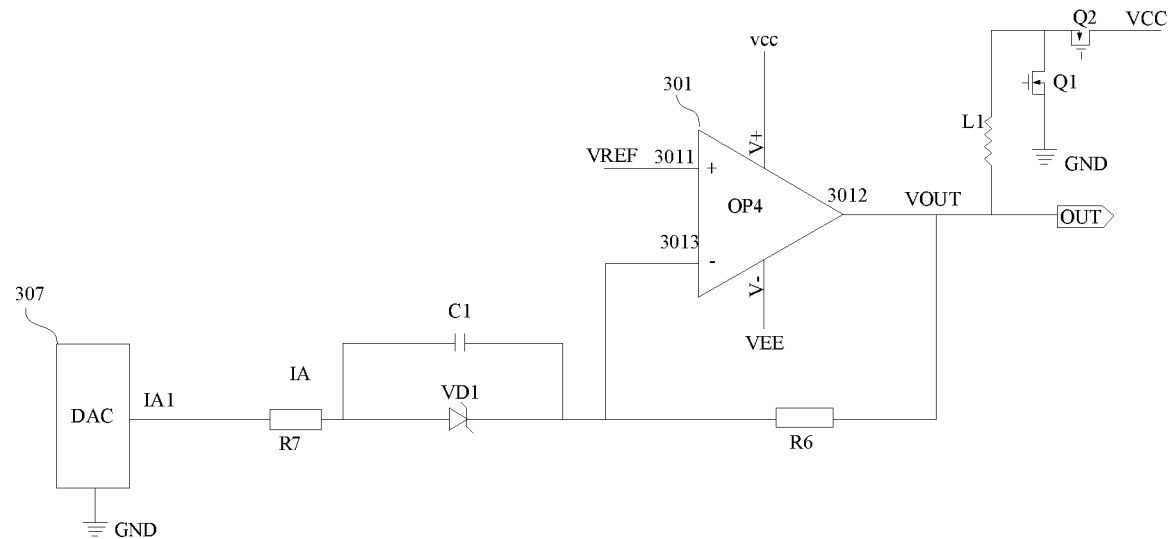
FIG. 13 is a schematic diagram of a circuit of another envelope tracking device according to Embodiment 1 of the present disclosure.

As shown in FIG. 13, the switch circuit includes an inductor L1, a first MOS transistor Q1, and a second MOS transistor Q2. A first terminal of the inductor L1 is connected to the output terminal 3012 of the operational amplifier. A source electrode of the first MOS transistor Q1 is grounded. A drain electrode of the first MOS transistor Q1 is connected to a second terminal of the inductor L1. A drain electrode of the second MOS transistor Q2 is connected to a power supply VCC. A source electrode of the second MOS transistor Q2 is connected to a second terminal of an inductor L2. In some embodiments, the switch circuit is further connected to a load, and provides a part of the current required by the load via the BUCK circuit to reduce the output current of the operational amplifier, thereby reducing the power consumption of the operational amplifier and improving the efficiency.

For ease of understanding, the envelope tracking device provided by the present disclosure is further described below through one exemplary embodiment.

Figure 14:
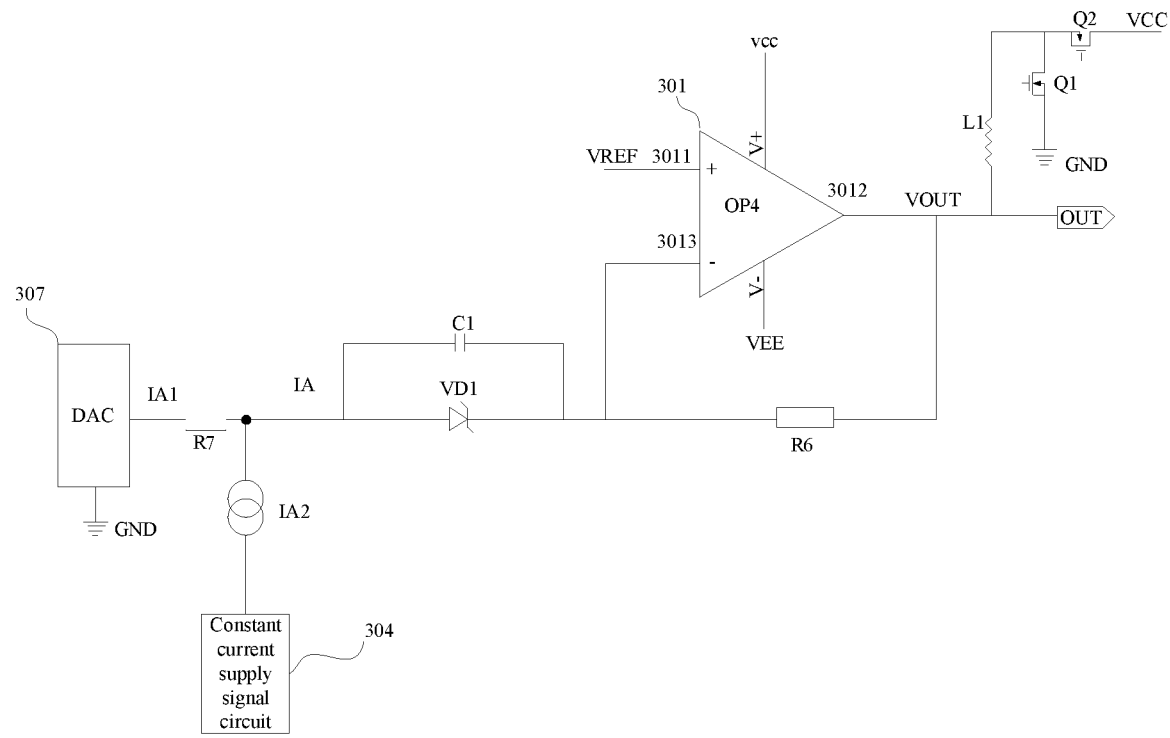
FIG. 14 is a schematic diagram of a circuit of another envelope tracking device according to Embodiment 1 of the present disclosure.

As shown in FIG. 14, the envelope tracking device consists of a DAC 307, a bias resistor R7, a constant current supply signal circuit 304, a boost circuit consisting of a capacitor C1 and a zener diode VD1, a amplifier circuit, as well as a BUCK switch circuit consisting of a inductor L1, a first MOS transistor Q1, and a second MOS transistor Q2. The amplifier circuit includes an operational amplifier 301 and a feedback network consisting of a feedback resistor R6. A connection relationship between various parts is shown in FIG. 14. The power supply negative terminal of the DAC 307 is grounded. The output terminal of the DAC 307 is connected in series with one terminal of the bias resistor R7, and the other terminal of the bias resistor R7 is connected to one terminal where a positive electrode of the zener diode VD1 is connected in parallel with the capacitor C1. Additionally, the positive electrode of the zener diode VD1 is also connected to a constant current supply signal circuit 304. The negative electrode of the zener diode VD1 is connected to the inverting input terminal 3013 of the operational amplifier 301. The operational amplifier 301 operates in the mode of the floating ground. The operational amplifier 301 includes a non-inverting input terminal 3011, a power supply negative terminal V−, a power supply positive terminal V+, an inverting input terminal 3013 and an output terminal 3012 of the operational amplifier. A reference voltage VREF is applied on the non-inverting input terminal 3011. The power supply negative terminal V− is connected to a first voltage supply VEE. The first voltage supply VEE has the capability of outputting and inputting a current. The power supply positive terminal V+ is connected to the second voltage supply VCC. The reference voltage VREF has a voltage value greater than a voltage value of the first voltage supply VEE. The reference voltage VREF has a voltage value smaller than a voltage value of the second voltage supply VCC. The voltage value of the first voltage supply VEE is greater than zero. The first terminal of the feedback resistor R6 is connected to the inverting input terminal 3013. The second terminal of the feedback resistor R6 is connected to the output terminal 3012 of the operational amplifier, and configured to transmit the output voltage signal of the output terminal 3012 of the operational amplifier to the inverting input terminal 3013. The first terminal of the inductor L1 is connected to the output terminal of the operational amplifier. A source electrode of the first MOS transistor Q1 is grounded. A drain electrode of the first MOS transistor Q1 is connected to a second terminal of the inductor L1. A drain electrode of the second MOS transistor Q2 is connected to the power supply. A source electrode of the second MOS transistor Q2 is connected to a second terminal of an inductor L1.

After the DAC 307 outputs the envelope tracking input current signal IA1, and after the envelope tracking input current signal IA1 and a constant current supply current signal IA2 of a constant current supply signal circuit is superimposed to generate the target envelope tracking input current signal IA. After being transmitted via the boost circuit consisting of the capacitor C1 and the zener diode VD1, the envelope tracking input current signal is provided to the inverting input terminal 3013 of the operational amplifier 301. The amplifier circuit is configured to perform closed-loop conversion and amplification on the target envelope tracking input current signal, and the output terminal 3012 of the operational amplifier outputs the envelope tracking output voltage VOUT. The feedback resistor R6 of the amplifier circuit may transmit the output voltage signal of the output terminal 3012 of the operational amplifier to the inverting input terminal 3013, thereby forming the closed-loop conversion and amplification.

According to different models of the DAC, the output envelope tracking input current signal may be a positive current (that is, the current flows out of the output terminal of the DAC) or a negative current (that is, the current flows from the output terminal of the DAC). When the output envelope tracking input current signal is a positive current, the constant current supply signal circuit needs to be provided to convert the envelope tracking input current signal into the target envelope tracking input current signal that meets the subsequent requirements.

According to the principle of the circuit, under an ideal condition, the magnitude of the current flowing through the resistor R6 is consistent with the magnitude of an input envelope tracking input current signal.

Because a current signal is transmitted through the boost circuit, after the target envelope tracking input current signal passes through the boost circuit, the magnitude of the target envelope tracking input current signal is not changed, that is, if the constant current supply circuit is provided, the magnitude of the target envelope tracking input current signal acquired after superposition of the envelope tracking input current signal and the constant current supply current signal is consistent with the magnitude of the target envelope tracking input current signal flowing out of the boost circuit. If the constant current supply circuit is not provided, the envelope tracking input current signal and the target envelope tracking input current signal have consistent magnitudes.

In some embodiments, a bias voltage required for normal operation is provided to the DAC via the bias resistor, and the magnitude of the bias voltage is as follows: VREF−voltage drop of the boost circuit−voltage drop of a feedback resistor.

In some embodiments, a conversion formula between the target envelope tracking input current signal and the output envelope tracking output voltage VOUT meets the following relationship: the output envelope tracking output voltage VOUT=reference voltage VREF+resistance value of the feedback resistor*target envelope tracking input current signal IA. Because the current signal is transmitted through the boost circuit, when the constant current supply circuit is not provided in the circuit, the magnitude of the target envelope tracking input current signal IA is consistent with the magnitude of the envelope tracking input current signal IA1.

The magnitude of the output envelope tracking output voltage VOUT is between the VREF and the VCC.

Through forgoing circuits, the envelope tracking input current signal IA1 is amplified into the output envelope tracking output voltage VOUT, and an absolute value of an actual operating voltage of the operational amplifier 301 is VCC−VEE. An actual output swing of the operational amplifier OP4 is between (VREF−VEE) and (VCC−VEE), so that the operational amplification can operate in the mode of the floating ground, which reduces the loss of the operational amplifier 301 and improves the efficiency. For example, when the VCC=30V, the VREF=10V, and the VEE=8V, the power supply voltage of the operational amplifier is 22 v. For the operational amplifier, the output voltage is in a range of 2V-20V. By contrast, if the operational amplifier is directly grounded, the same amplification result can only be achieved under the premise that the power supply voltage of the operational amplifier is 30 v, and the output voltage is in a range of 12-30 v. It can be concluded that the circuits provided in the embodiments of the present disclosure reduce the amplification loss and improve the efficiency.

Figures 1, 15:
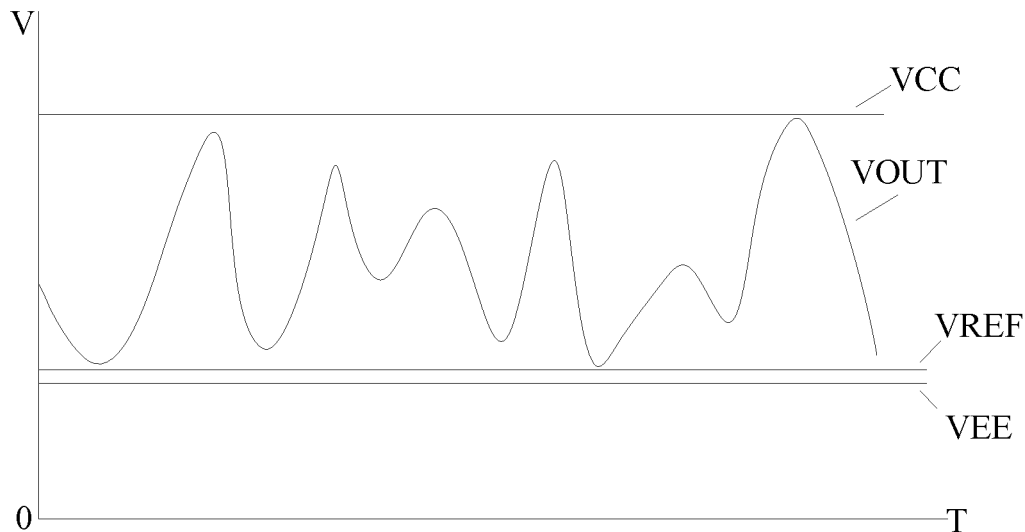
Figures 2, 15:
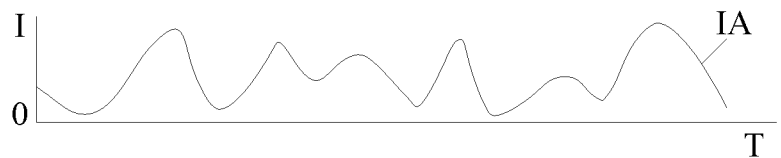

Signal waveforms of the envelope tracking device of the embodiments of the present disclosure at different positions during operation are shown in FIG. 15-1 and FIG. 15-2. The IA is the target envelope tracking input current signal, and is a high-frequency varying signal. The VOUT is the output envelope tracking output voltage amplified by the circuit, and the magnitude of the VOUT is between the VREF and the VCC. The input current signal IA and the output voltage VOUT have a linear amplification relationship. A power supply voltage of the power supply positive terminal of the operational amplifier is the VCC. A power supply voltage of the power supply negative terminal of the operational amplifier is the VEE. A reference voltage VREF is applied to the non-inverting input terminal of the operational amplifier, and VREF>VEE>0.

The envelope tracking device provided by the embodiments of the present disclosure includes the amplifier circuit consisting of the operational amplifier and the feedback network, and the boost circuit. After transmitted through the booster circuit, the target envelope tracking input current signal is converted by the amplifier circuit to acquire the envelope tracking output voltage. The embodiments of the present disclosure solve the problems in the related art of high loss and low efficiency of the operational amplifier in a linear amplification process when the envelope tracking output voltage has high magnitude and great swing. Therefore, the target envelope tracking input current signal can be more effectively converted; the conversion efficiency of the operational amplifier is improved; amplification loss is reduced, and user experience is improved.

In some exemplary implementations, the power supply negative terminal of the DAC is grounded. The negative terminal of the operational amplifier is not directly grounded. After the envelope tracking input current signal output by the DAC passes through the boost circuit, the current signal is not affected. The current signal is applied to the reverse input terminal of the operational amplifier, output after linearly amplified by the operational amplifier, and used for a subsequent power amplifier load. The exemplary implementations of the present disclosure solve the problem of signal transmission when the DAC and the operational amplifier do not operate under common ground.

In some exemplary implementations, the power supply negative terminal V− of the operational amplifier is connected to a voltage supply with higher voltage (the voltage at the power supply positive terminal V+ is higher than the voltage at the power supply negative terminal V−), and is not directly grounded. In this way, the actual power supply voltage of the operational amplifier is a voltage difference between the power supply positive terminal V+ and the power supply negative terminal V− to reduce the range of the actual operating power supply voltage of the operational amplifier, that is, the operational amplifier operates in the mode of floating ground, thereby reducing the power consumption of the operational amplifier and improving the amplification efficiency.

In some exemplary implementations, when the envelope tracking input current signal output by the DAC is positive, a constant current supply circuit is added. The target envelope tracking input current signal sent into the operational amplifier is acquired by subtracting the constant current supply current signal from the envelope tracking input current signal.

In some exemplary implementations, when the envelope tracking input current signal output by the DAC is negative, a constant current supply circuit may be added if necessary. The target envelope tracking input current signal sent into the operational amplifier is acquired by subtracting the constant current supply current signal from the envelope tracking input current signal.

In some exemplary implementations, the switch circuit is connected in parallel with the output terminal to provide part of the current required by a load of the power amplifier, thereby reducing the output current of the operational amplifier, and improving the efficiency of the operational amplifier.

Embodiment 2

Figure 16:
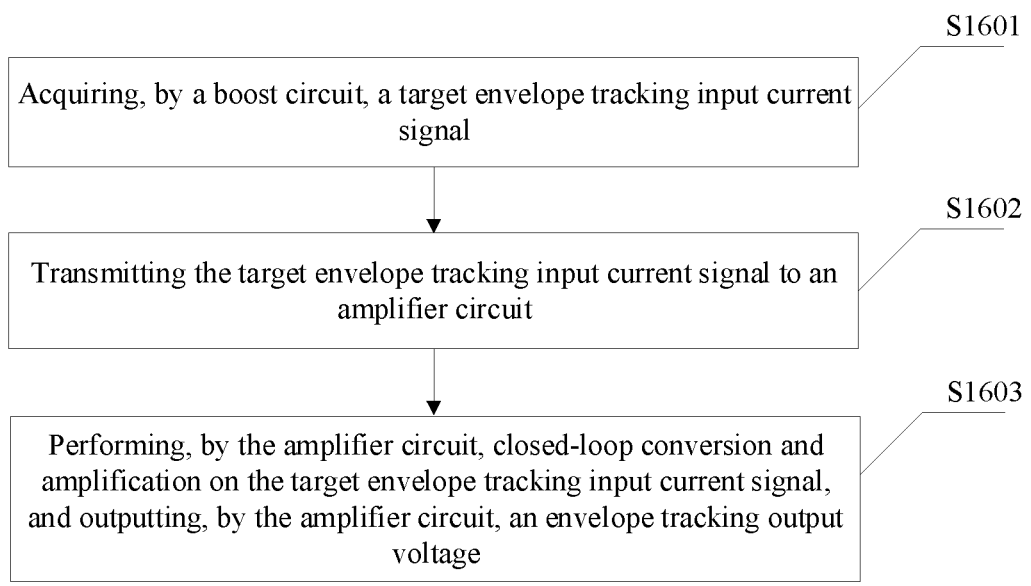
FIG. 16 is a schematic flowchart of an envelope tracking method according to Embodiment 2 of the present disclosure.

The present embodiment provides an envelope tracking method, as shown in FIG. 16, the method includes the following operations.

At S1601, a boost circuit acquires a target envelope tracking input current signal.

At S1602, the target envelope tracking input current signal is transmitted to an amplifier circuit.

At S1603, the amplifier circuit performs closed-loop conversion and amplification on the target envelope tracking input current signal, and outputs an envelope tracking output voltage.

In some embodiments, the forgoing envelope tracking method may be applied to an envelope tracking device described in any of the forgoing embodiments.

In some embodiments, the target envelope tracking input current signal may be an envelope current signal directly output by a DAC, or may be a current signal acquired by further processing an envelope current signal output by the DAC.

In some embodiments, the amplifier circuit includes an operational amplifier and a feedback network. The operational amplifier operates in a mode of floating ground.

In some embodiments, a power supply negative terminal of the operational amplifier is connected to a first voltage supply VEE providing a higher voltage. The voltage of the first voltage supply VEE is smaller than the voltage of a second voltage supply VCC connected to a power supply positive terminal of the operational amplifier. A reference voltage VREF is applied to a non-inverting input terminal of the operational amplifier. A relationship among the VCC, the VREF, and the VEE is as follows: VCC>VREF>VEE>0V. Through the forgoing settings, the operational amplifier is enabled to operate in the mode of the floating ground.

Because the current signal is transmitted through the boost circuit, after the target envelope tracking input current signal passes through the boost circuit, a magnitude of the target envelope tracking input current signal is not changed, that is, if a constant current supply circuit is provided, the magnitude of the target envelope tracking input current signal acquired after superposition of an envelope tracking input current signal and a constant current supply current signal is consistent with the magnitude of the target envelope tracking input current signal flowing out of the boost circuit. If the constant current supply circuit is not provided, the envelope tracking input current signal and the target envelope tracking input current signal have the same magnitude.

In some embodiments, a magnitude of the reference voltage VREF applied on the non-inverting input terminal of the operational amplifier may be set by the person having ordinary skill in the art as required.

According to the principle of the operational amplifier, voltage levels of the non-inverting input terminal 3011 and the inverting input terminal 3013 are consistent.

In some embodiments, the voltage of the first voltage supply VEE connected to the power supply negative terminal V− is smaller than the voltage of the second voltage supply VCC connected to the power supply positive terminal V+ and the first voltage supply VEE is not directly grounded. Therefore, an actual power supply voltage of the operational amplifier is a voltage difference between the power supply positive terminal V+ and the power supply negative terminal V−, so as to reduce a range of an actual operating power supply voltage of the operational amplifier, that is, the operational amplifier operates in a mode of floating ground, thereby reducing the power consumption of the operational amplifier and improving amplification efficiency.

In some embodiments, the first voltage supply has capability of outputting and inputting a current.

In some embodiments, the feedback network in the amplifier circuit consists of a feedback resistor R6. The feedback resistor R6 is connected between an inverting input terminal of the operational amplifier and an output terminal of the operational amplifier. According to the principle of a circuit, under an ideal condition, a magnitude of a current flowing through the feedback resistor R6 is consistent with a magnitude of a current of a target envelope tracking input current signal IA. The target envelope tracking input current signal IA is applied to the inverting input terminal of the operational amplifier after passing through the boost circuit, and is converted by the operational amplifier and the feedback resistor R6 to acquire an amplified output envelope tracking output voltage VOUT. In some embodiments, a conversion formula between the target envelope tracking input current signal IA and the output envelope tracking output voltage VOUT meets the following relationship: VOUT=VREF+ R6*IA. A magnitude of the output voltage VOUT is between the VREF and the VCC. By virtue of this circuit, the target envelope tracking input current signal IA is amplified into the output envelope tracking output voltage VOUT, and an absolute value of an actual operating voltage of an operational amplifier OP4 is VCC−VEE. An actual output swing of the operational amplifier OP4 is between (VREF−VEE) and (VCC−VEE), so that the operational amplifier can operate in the mode of the floating ground, thereby reducing the loss of the operational amplifier OP4 and improving the efficiency.

In some embodiments, the amplifier circuit transmits an output voltage signal of the operational amplifier back to the power supply negative terminal of the operational amplifier via the feedback network.

In some embodiments, before acquiring the target envelope tracking input current signal, the envelope tracking method further includes: a constant current supply signal circuit converts the envelope tracking input current signal into the target envelope tracking input current signal.

In order to meet a current signal required by the boost circuit, the target envelope tracking input current signal is a negative current. That is, the target envelope tracking input current signal is in a direction from the second terminal of the boost circuit to the first terminal of the boost circuit. The constant current supply signal circuit provides a DC constant current supply current signal with a constant output. A direction and a magnitude of the constant current supply current signal may be set by the person having ordinary skill in the art as required.

In some embodiments, if the envelope tracking input current signal is a negative current, and the constant current supply current signal is a positive current, the target envelope tracking input current signal is acquired after the constant current supply current signal of the constant current supply signal circuit is subtracted from the envelope tracking input current signal. The envelope tracking input current signal is greater than or equal to the constant current supply current signal of the constant current supply signal circuit.

In some embodiments, if the envelope tracking input current signal is a negative current, and the constant current supply current signal is a negative current, the target envelope tracking input current signal is acquired after the envelope tracking input current signal is added to the constant current supply signal of the constant current supply signal circuit.

For the constant current supply signal circuit 304, the current signal flowing into the constant current supply signal circuit 304 is a negative current, and the current signal flowing out of the constant current supply signal circuit 304 is a positive current.

If the envelope tracking input current signal is a negative current, whether the constant current supply signal circuit needs to be set may be determined as required.

In some embodiments, if the envelope tracking input current signal is a positive current, the target envelope tracking input current signal is acquired after the constant current supply current signal of the constant current supply signal circuit is subtracted from the envelope tracking input current signal. The envelope tracking input current signal is less than or equal to the constant current supply current signal of the constant current supply signal circuit.

If the envelope tracking input current signal is a positive current, the constant current supply signal circuit needs to be provided. Through the constant current supply signal circuit, a DC current supply current signal with a constant magnitude can be generated for processing the envelope tracking input current signal IA1, so that the target envelope tracking input current signal IA meets the requirements.

The constant current supply current signal may be either a positive current or a negative current. The magnitude and the direction of the constant current supply current signal may be set by the person having ordinary skill in the art according to the magnitude and the direction of the envelope tracking input current signal corresponding to the constant current supply current signal. Therefore, through the constant current supply signal circuit, a DC current supply current signal with a constant magnitude can be generated for processing the envelope tracking input current signal IA1, so that the target envelope tracking input current signal IA meets the requirements.

If the envelope tracking input current signal IA1 is a negative current, the current of the constant current supply current signal IA2 may be either a positive current or a negative current. If the envelope tracking input current signal IA1 is a positive current, the current of the constant current supply current signal IA2 may only be a negative current.

In some embodiments, the envelope tracking method further includes: the switch circuit provides a part of current required by a load to reduce an output current of the operational amplifier.

In some embodiments, the switch circuit is connected in parallel to the output terminal to provide a part of the current required by the load, reduce the output current of the operational amplifier, and improve the efficiency of the operational amplifier. The load may be a power amplifier.

In some embodiments, the envelope tracking method further includes the following operations.

The DAC outputs the envelope tracking input current signal.

A power supply negative terminal of the DAC is grounded. An output terminal of the DAC is connected to the first terminal of the boost circuit, and configured to output the envelope tracking input current signal after conversion.

When the constant current supply signal circuit is not provided between the DAC and the boost circuit, the envelope tracking input current signal is the target envelope tracking input current signal. When the envelope tracking input current signal is a negative current, the current flows from the output terminal of the DAC into an inner part of the DAC.

In some embodiments, the envelope tracking method further includes the following operation.

A bias resistor provides the DAC with a bias voltage required for normal operation.

In some embodiments, a magnitude of the bias voltage is as follows: VREF−voltage drop of the boost circuit−voltage drop of R7.

In some embodiments, the boost circuit includes a zener diode and a capacitor. The zener diode is connected in parallel with the capacitor, and one terminal where a positive electrode of the zener diode is connected in parallel with the capacitor serves as the first terminal of the boost circuit.

In some embodiments, the boost circuit may consist of the zener diode and the capacitor that are connected in parallel with each other. Under such conditions, the target envelope tracking input current signal is connected to a second terminal of the bias resistor from one terminal where the zener diode is connected in parallel with the capacitor to provide a bias voltage required for operation of an output port of the DAC. The magnitude of the bias voltage is as follows: VREF−voltage drop of the zener diode−voltage drop of the bias resistor. One terminal of a negative electrode of the zener diode is connected in parallel with one terminal of the capacitor and then connected to the inverting input terminal of the operational amplifier. After the voltage is boosted by the zener diode, the target envelope tracking input current signal is transmitted to the inverting input terminal of the operational amplifier. The target envelope tracking input current signal flows through the capacitor and the zener diode, and most of the current signal flows through the capacitor, so that the zener diode has a better voltage stabilization effect.

In some embodiments, the boost circuit includes a stabilized voltage supply.

In some embodiments, the stabilized voltage supply is configured to provide a suitable voltage stabilization voltage, and transmit the target envelope tracking input current signal to the inverting input terminal of the operational amplifier. After the target envelope tracking input current signal is amplified by the operational amplifier, the envelope tracking output voltage VOUT is acquired. Under such conditions, a bias voltage required for operation of an output port of the DAC is provided. The magnitude of the bias voltage is as follows: VREF−voltage of the stabilized voltage supply−voltage drop of the bias resistor.

In some embodiments, the switch circuit includes an inductor, a first MOS transistor, and a second MOS transistor;

A first terminal of the inductor is connected to the output terminal of the operational amplifier.

A source electrode of the first MOS transistor is grounded, and a drain electrode of the first MOS transistor is connected to a second terminal of the inductor.

A drain electrode of the second MOS transistor is connected to a power supply, and a source electrode of the second MOS transistor is connected to the second terminal of the inductor.

In some embodiments, the switch circuit is further connected to a load. The output current of the operational amplifier is reduced via a BUCK circuit, thereby reducing the power consumption of the operational amplifier and improving the efficiency.

Embodiment 3

Figure 17:
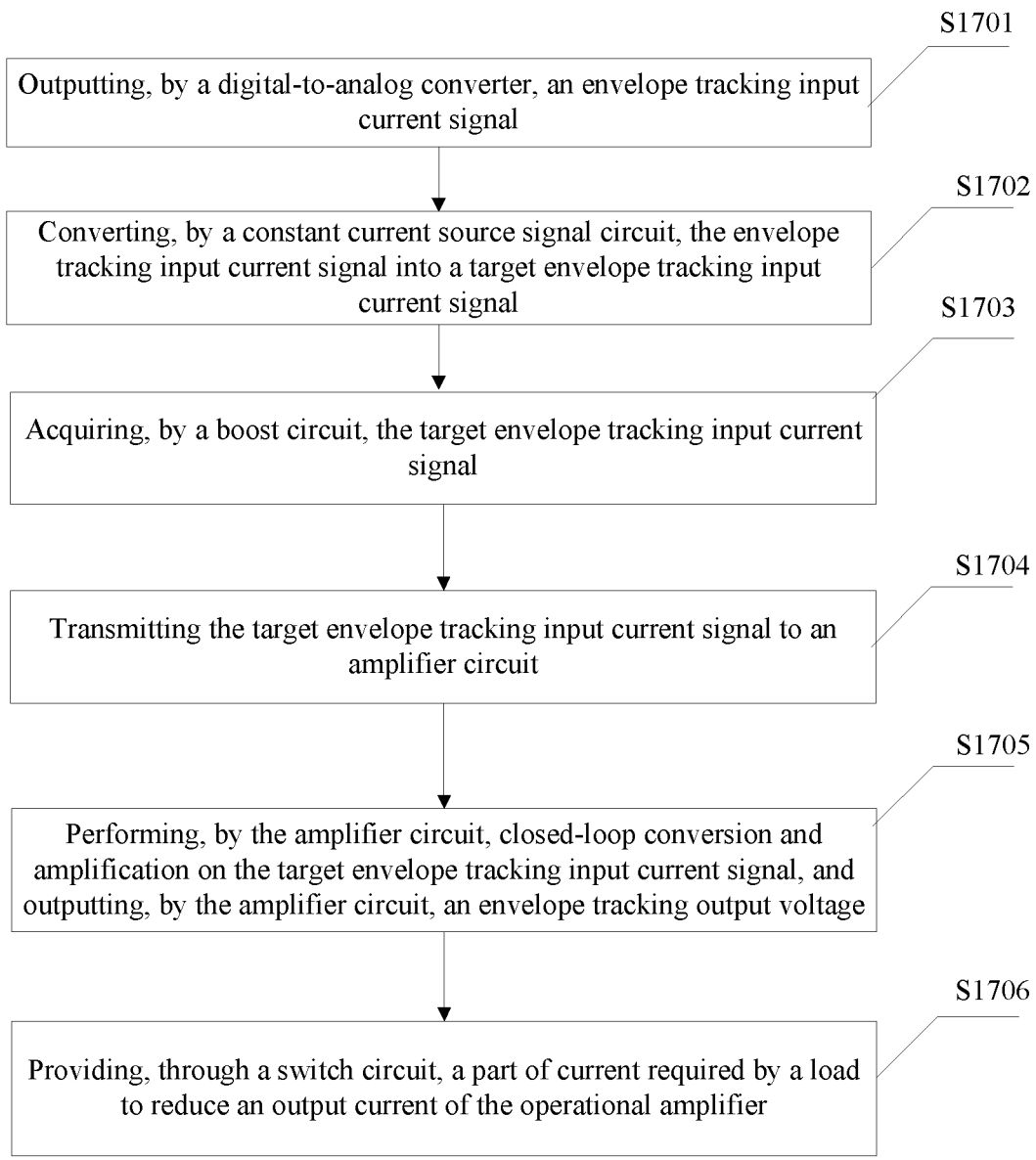
FIG. 17 is a schematic flowchart of an exemplary implementation of an envelope tracking method according to Embodiment 3 of the present disclosure.

The forgoing envelope tracking method is further described below through one exemplary embodiment. Referring to FIG. 17, as shown in FIG. 17, an exemplary envelope tracking method includes the following operations.

At S1701, a DAC outputs an envelope tracking input current signal.

At S1702, a constant current supply signal circuit converts the envelope tracking input current signal into a target envelope tracking input current signal.

At S1703, a boost circuit acquires the target envelope tracking input current signal.

At S1704, the target envelope tracking input current signal is transmitted to an amplifier circuit.

At S1705, an amplifier circuit performs closed-loop conversion and amplification on the target envelope tracking input current signal, and outputs an envelope tracking output voltage.

At S1706, a switch circuit provides a part of current required by a load to reduce an output current of the operational amplifier.

The amplifier circuit includes an operational amplifier and a feedback network. The feedback network is configured to transmit an output voltage signal of an output terminal of the operational amplifier to an inverting input terminal of the operational amplifier, thereby forming the closed-loop conversion and amplification.

According to different models of a DAC, an output envelope tracking input current signal may be a positive current (that is, a current flows out of an output terminal of the DAC) or a negative current (that is, the current flows from the output terminal of the DAC). When the output envelope tracking input current signal is a positive current, the constant current supply signal circuit needs to be provided to convert an envelope tracking input current signal into the target envelope tracking input current signal that meets the subsequent requirements.

According to the principle of a circuit, under an ideal condition, a magnitude of a current flowing through a resistor R6 is consistent with a magnitude of an input envelope tracking input current signal.

Because a current signal is transmitted through the boost circuit, after the target envelope tracking input current signal passes through the boost circuit, a magnitude of the target envelope tracking input current signal is not changed. That is, if a constant current supply circuit is provided, the magnitude of the target envelope tracking input current signal acquired after superposition of the envelope tracking input current signal and a constant current supply current signal is consistent with the magnitude of the target envelope tracking input current signal flowing out of the boost circuit. If the constant current supply circuit is not provided, the envelope tracking input current signal and the target envelope tracking input current signal have consistent magnitudes.

In some embodiments, a bias voltage required for normal operation is provided to the DAC via a bias resistor, and a magnitude of the bias voltage is as follows: VREF−voltage drop of the boost circuit−voltage drop of the feedback resistor.

In some embodiments, a conversion formula between the target envelope tracking input current signal and the output envelope tracking output voltage VOUT meets the following relationship: output envelope tracking output voltage VOUT=reference voltage VREF+resistance value of the feedback resistor*target envelope tracking input current signal IA. Because the current signal is transmitted through the boost current, when the constant current supply circuit is not provided in the circuit, a magnitude of the target envelope tracking input current signal IA is consistent with the magnitude of the envelope tracking input current signal IA1.

A magnitude of an output voltage of the output envelope tracking output voltage VOUT is between the VREF and the VCC.

Through the forgoing circuit, the envelope tracking input current signal IA1 is amplified into the output envelope tracking output voltage VOUT. An absolute value of an actual operating voltage of the operational amplifier is VCC−VEE. An actual output swing of an operational amplifier OP4 is between (VREF−VEE) and (VCC−VEE), so that operational amplification can operate in a mode of floating ground, which reduces the loss of the operational amplifier and improves the efficiency. For example, when the VCC=30V, the VREF=10V, and the VEE=8V, the power supply voltage of the operational amplifier is 22 v. For the operational amplifier, the output voltage is in a range of 2V-20V. By contrast, if the operational amplifier is directly grounded, the same amplification result can only be achieved under the premise that the power supply voltage of the operational amplifier is 30 v, and the output voltage is in a range of 12-30 v. It can be concluded that the circuits provided in the embodiments of the present disclosure reduce the amplification loss and improve the efficiency.

The embodiments of the present disclosure provide an envelope tracking method. A boost circuit acquires a target envelope tracking input current signal, and transmits the target envelope tracking input current signal to an amplifier circuit. The amplifier circuit includes an operational amplifier and a feedback network. The operational amplifier operates in a mode of floating ground. The amplifier circuit performs closed-loop conversion and amplification on the target envelope tracking input current signal to output an envelope tracking output voltage. The problems in the related art of high loss and low efficiency of the operational amplifier in a linear amplification process when the envelope tracking output voltage has high magnitude and great swing are solved. The target envelope tracking input current signal can be more effectively converted and amplified; the conversion efficiency of the operational amplifier is improved; amplification loss is reduced; and user experience is improved.

In some cases, at least one of the operations shown or described may be performed in an order different from that described in the above embodiments.

The above content is a further detailed description of the embodiments of the present disclosure in conjunction with exemplary embodiments, and it cannot be considered that the exemplary implementation of the present disclosure is limited to these descriptions. For the person having ordinary skill in the art to which the present disclosure pertains, a plurality of simple deductions or substitutions may be made without departing from the concept of the embodiments of the present disclosure, which should be regarded as belonging to the protection scope of the present disclosure.

What is claimed is:

1. An envelope tracking device, comprising an amplifier circuit and a boost circuit, wherein the amplifier circuit comprises an operational amplifier and a feedback network;
   the operational amplifier comprises a non-inverting input terminal, a power supply negative terminal, a power supply positive terminal, an inverting input terminal and an output terminal of the operational amplifier, a reference voltage VREF is applied on the non-inverting input terminal, the power supply negative terminal is connected to a first voltage supply VEE, the power supply positive terminal is connected to a second voltage supply VCC, the reference voltage VREF has a voltage value greater than a voltage value of the first voltage supply VEE, the reference voltage VREF has a voltage value smaller than a voltage value of the second voltage supply VCC, and the voltage value of the first voltage supply VEE is greater than zero;
   a first terminal of the boost circuit receives a target envelope tracking input current signal, and a second terminal of the boost circuit is connected to the inverting input terminal, and configured to transmit the target envelope tracking input current signal to the inverting input terminal via the boost circuit, wherein the target envelope tracking input current signal is then transmitted to the operational amplifier;
   a first terminal of the feedback network is connected to the inverting input terminal, and a second terminal of the feedback network is connected to an output terminal of the operational amplifier, and configured to transmit an output voltage signal of the output terminal of the operational amplifier to the inverting input terminal; and
   the amplifier circuit is configured to perform closed-loop conversion and amplification on the target envelope tracking input current signal, and the output terminal of the operational amplifier outputs an envelope tracking output voltage,
   wherein the boost circuit comprises a stabilized voltage supply; or the boost circuit comprises a zener diode and a capacitor, the zener diode is connected in parallel with the capacitor, and one terminal where a positive electrode of the zener diode is connected in parallel with the capacitor serves as the first terminal of the boost circuit.

2. The envelope tracking device according to claim 1, wherein the envelope tracking device further comprises a constant current supply signal circuit,
   the constant current supply signal circuit is connected to the first terminal of the boost circuit, and configured to convert an envelope tracking input current signal into the target envelope tracking input current signal.

3. The envelope tracking device according to claim 1, wherein the envelope tracking device further comprises a switch circuit, the switch circuit is connected to the output terminal of the operational amplifier, and the switch circuit is connected to a load, and configured to reduce an output current of the operational amplifier.

4. The envelope tracking device according to claim 1, wherein the envelope tracking device further comprises a digital-to-analog converter (DAC),
   a power supply negative terminal of the DAC is grounded, and an output terminal of the DAC is connected to the first terminal of the boost circuit, and configured to output the envelope tracking input current signal after conversion.

5. The envelope tracking device according to claim 4, wherein the envelope tracking device further comprises a bias resistor;
   the bias resistor is connected between the output terminal of the DAC and the first terminal of the boost circuit, and configured to provide the DAC with a bias voltage required for normal operation.

6. An envelope tracking method, performed by the envelope tracking device according to claim 1 and comprising:
   acquiring, by the boost circuit, a target envelope tracking input current signal, and transmitting, by the boost circuit, the target envelope tracking input current signal to the amplifier circuit, wherein the operational amplifier operates in a mode of floating ground; and
   performing, by the amplifier circuit, closed-loop conversion and amplification on the target envelope tracking input current signal, and outputting, by the amplifier circuit, an envelope tracking output voltage.

7. The envelope tracking method according to claim 6, before acquiring the target envelope tracking input current signal, the envelope tracking method further comprises;
   converting, by a constant current supply signal circuit, an envelope tracking input current signal into the target envelope tracking input current signal.

8. The envelope tracking method according to claim 7, wherein the envelope tracking method further comprises:
   reducing, by a switch circuit, an output current of the operational amplifier.

9. The envelope tracking method according to claim 6, wherein the envelope tracking method further comprises:

outputting, by a digital-to-analog converter (DAC), the envelope tracking input current signal.

10. The envelope tracking method according to claim 9, wherein the envelope tracking method further comprises:

providing, by a bias resistor, the DAC with a bias voltage required for normal operation.

11. The envelope tracking device according to claim 1, wherein the feedback network consists of a feedback resistor R6, wherein the feedback resistor R6 is connected between the inverting input terminal of the operational amplifier and the output terminal of the operational amplifier.

12. The envelope tracking device according to claim 11, wherein a conversion formula between the target envelope tracking input current signal IA and the output envelope tracking output voltage VOUT meets the following relationship: VOUT=VREF+R6*IA.

13. The envelope tracking device according to claim 2, wherein if the envelope tracking input current signal IA1 is a negative current, and a constant current supply current signal IA2 of the constant current supply signal circuit is a positive current, the target envelope tracking input current signal IA=IA1−IA2, where IA2≤IA1; or, if the envelope tracking input current signal IA1 is a negative current, and a constant current supply current signal IA2 of the constant current supply signal circuit is also a negative current, the target envelope tracking input current signal IA=IA1+IA2; or, if the envelope tracking input current signal IA1 is a positive current, the target envelope tracking input current signal IA=IA2−IA1, where IA1≤IA2.

14. The envelope tracking device according to claim 2, wherein if the envelope tracking input current signal IA1 is a negative current, a current of a constant current supply current signal IA2 of the constant current supply signal circuit is either a positive current or a negative current; or, if the envelope tracking input current signal IA1 is a positive current, a current of a constant current supply current signal IA2 of the constant current supply signal circuit is a negative current.

15. The envelope tracking device according to claim 3, wherein the switch circuit is configured to provide a part of current required by the load to reduce the output current of the operational amplifier.

16. The envelope tracking device according to claim 5, wherein in a case of the bias resistor R7, a magnitude of the bias voltage is as follows: VREF−voltage drop of the boost circuit−voltage drop of R7.

* * * * *